(12) United States Patent
Ishikawa (10) Patent No.: US 7,692,451 B2
(45) Date of Patent: Apr. 6, 2010

(54) OPEN-DRAIN OUTPUT CIRCUIT

(75) Inventor: Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/710,941

(22) Filed: Feb. 27, 2007

(65) Prior Publication Data
US 2007/0205806 A1 Sep. 6, 2007

(30) Foreign Application Priority Data
Mar. 1, 2006 (JP) ............... 2006-054707

(51) Int. Cl.
*H03K 19/094* (2006.01)
(52) U.S. Cl. ............... 326/86; 326/30; 326/83; 327/108
(58) Field of Classification Search .......... 326/21, 326/30, 83, 86, 90–93; 327/108–109, 113, 327/172, 263, 380, 170
See application file for complete search history.

(56) References Cited

U.S. PATENT DOCUMENTS 6,054,881 A * 4/2000 Stoenner ............ 327/112
6,222,403 B1 * 4/2001 Mitsuda ............. 327/170
6,411,122 B1 * 6/2002 Mughal et al. ........ 326/30
6,624,662 B1 * 9/2003 Volk ................. 326/87
6,853,213 B2 * 2/2005 Funaba .............. 326/30
7,026,847 B2 * 4/2006 Wang et al. .......... 327/112

FOREIGN PATENT DOCUMENTS

JP 06-268493 9/1994

* cited by examiner

*Primary Examiner*—Vibol Tan
*Assistant Examiner*—Christopher Lo
(74) *Attorney, Agent, or Firm*—Foley & Lardner LLP (57) ABSTRACT

A pulse generation section generates a pulse which is at H-level for the predetermined period of time from the timing of the input signal DATA changing to L-level. A main output section outputs a signal of L-level with transistors P1, N1, and N2 turned ON, while the pulse generation section outputs a pulse. When the pulse falls, the transistors P1 and N1 are turned OFF, and a potential of an output node is held at L-level by resistors of a L-level holding section.

31 Claims, 7 Drawing Sheets

OPEN-DRAIN OUTPUT CIRCUIT

BACKGROUND OF THE INVENTION

1. Field of the Invention

The present invention relates to an open-drain output circuit, or an output circuit having an open drain output terminal.

2. Description of the Related Art

Figure 6:
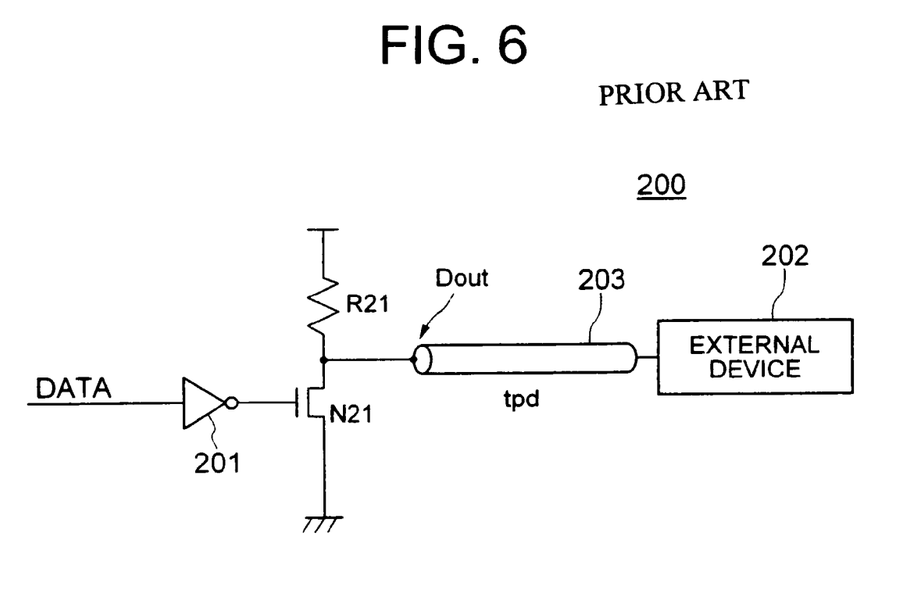
FIG. 6 is a circuit diagram showing the configuration of a conventional open-drain output circuit.

As an output circuit used for a semiconductor device, there is a known output circuit referred to as an open-drain output circuit, such as described in JP-6-268493A, for example. FIG. 6 shows the configuration of a conventional open-drain output circuit. In the conventional output circuit, generally designated at numeral 200, an input signal DATA is fed to a gate of the transistor N21 through an inverter 201. The output circuit 200 delivers an output signal from an output node Dout connecting a resistor R21 and an N-channel transistor N21 in series between a high-potential power source line and a low-potential power source line. The output signal is transmitted to an external device 202 via a signal transmission line 203. The resistor R21 is impedance-matched with the signal transmission line 203 having a delay time tpd.

Figure 7:
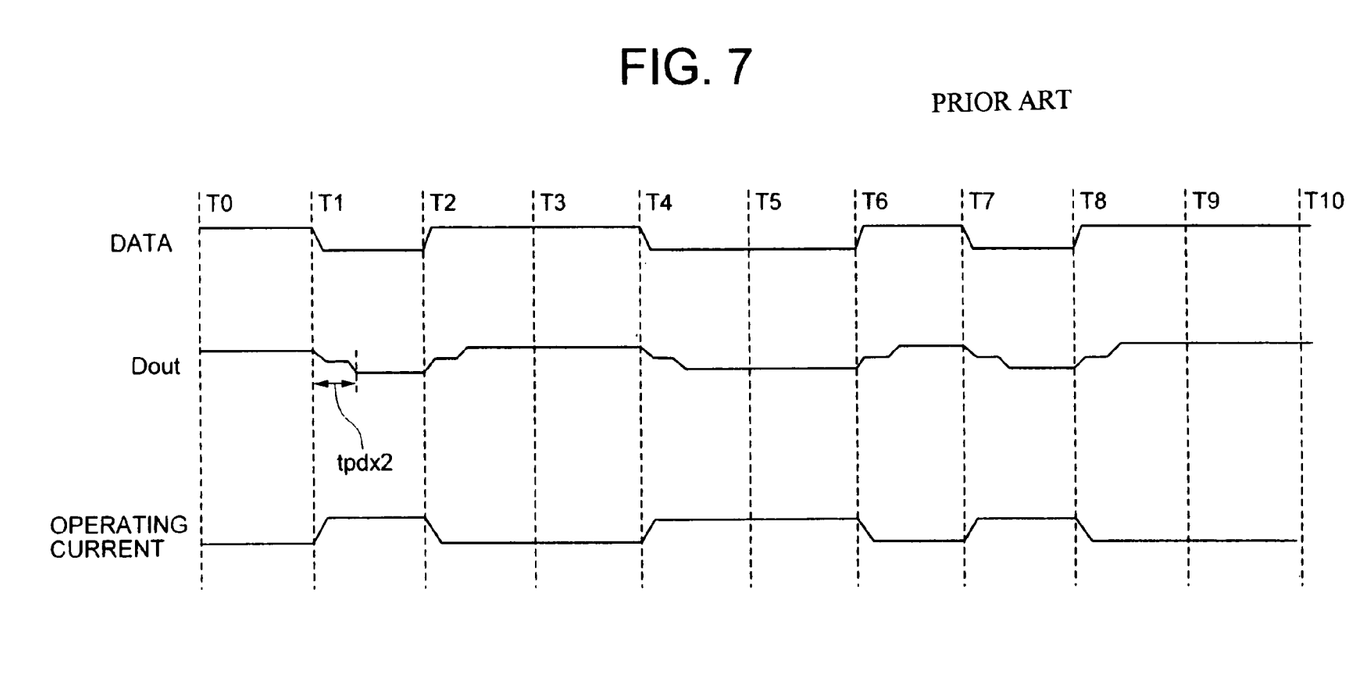
FIG. 7 is a timing chart showing signal waveforms in the conventional output circuit.

FIG. 7 shows a timing chart of an operation in the conventional output circuit as described above. When the input signal DATA is at a high level (H-level), the output circuit 200 connects the output node Dout thereof to the high-potential power source line via the resistor R21 by turning OFF the N-channel transistor N21, whereby the output signal assumes a H-level. On the other hand, when the input signal DATA is at a low level (L-level), the output circuit 200 connects the output node Dout thereof to the low-potential power source line via the transistor N21 by turning ON the N-channel transistor N21, whereby the output signal assumes a L-level.

It is to be noted that the potential of the output node Dout of the output circuit 200 does not change to the H-level or L-level immediately after the input signal DATA changes, due to an influence of a signal reflection, etc., and is settled at the H-level or L-level after a significant time interval is elapsed since the signal switching occurred. For example, when the input signal DATA changes from a H-level to a L-level in the case of the input terminal of the external device 202 being open, the signal is totally reflected by the input terminal of the external device 202. This signal reflection causes the potential of the output node Dout of the output circuit 200 to become gradually close to a L-level without immediately lowering to the L-level. The potential of the output node Dout is finally settled at the L-level after the input signal DATA assumes the L-level and the time period in which the signal reciprocates in the signal transmission line 203 elapses, that is, after the time delay of tpd×2 elapses.

In the output circuit 200, when a L-level signal is output, the current continues to flow from the high-potential power source line to the low-potential power source line via the resistor R21 and the transistor N21, with the transistor N21 being turned ON. For example, in FIG. 7, the current continues to flow in periods T1, T4 to T5, and T7, wherein the input signal DATA is at the L-level. In recent years, although the configuration achieving a lower power dissipation is ever required in the semiconductor device, the conventional output circuit 200 has a problem in that the power dissipation thereof is large due to the operating current which continues to flow at the L-level of the output node Dout.

SUMMARY OF THE INVENTION

It is an object of the present invention to provide an open-drain output circuit which can solve the above problem and reduce the operating current at a L-level of the open-drain output node thereof.

The present invention provides an output circuit including: an input node for receiving an input signal and an output node for outputting an output signal of the output circuit; a main output section for responding to a level of the input signal to charge or discharge the output node, thereby defining a low-level signal duration for outputting a low-level signal or a high-level signal duration for outputting a high-level signal; and a low-level hold section for maintaining the output node at a low level during the low-level signal duration, wherein the main output section is inactivated to stop discharging the output node in the low-level signal duration after elapse of a specific time length since a switch timing for start of the low-level signal duration.

In accordance with the output circuit of the present invention, the main output section promptly shifts the signal level of the output node in the low-level signal duration, inactivation of the main circuit section reduces the operating current in the low-level signal duration, and the low-level holding section maintains the output node at the low level in the low-level signal duration. Thus, the output circuit reduces the power dissipation in the low-level signal duration substantially without a delay in the signal transition from the high-level signal to the low-level signal.

The above and other objects, features and advantages of the present invention will be more apparent from the following description, referring to the accompanying drawings.

DETAILED DESCRIPTION OF THE PREFERRED EMBODIMENTS

Now, the present invention is more specifically described with reference to accompanying drawings, wherein similar constituent elements are designated by similar reference numerals.

Figure 1:
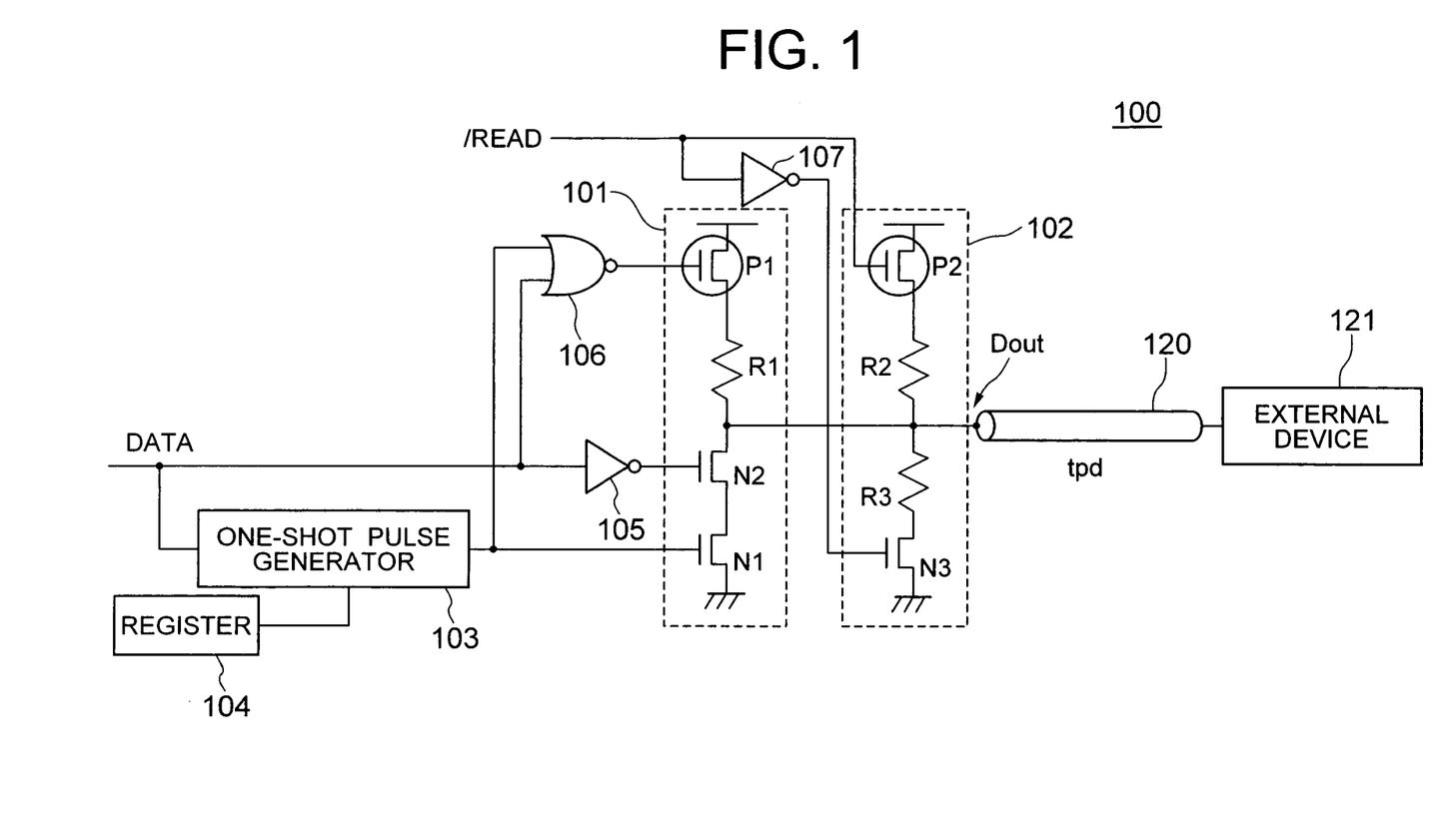
FIG. 1 is a circuit diagram showing the configuration of an output circuit according to a first embodiment of the present invention.

FIG. 1 is a circuit diagram showing the configuration of an open-drain output circuit according to a first embodiment of the present invention. The output circuit, generally designated at numeral 100, includes a main output section 101, which is provided with a pulse generation section 103 and a register 104, and a L-level holding section 102. The output circuit 100 is incorporated in a semiconductor device at the signal output side thereof, and outputs a signal corresponding to the input signal DATA input from the internal circuit of the semiconductor device toward an external device 121 via a signal transmission line 120 having a propagating delay time "tpd".

The main output section 101 outputs the potential corresponding to the input signal DATA through the output node Dout. Specifically, when the input signal DATA changes from a H-level to a L-level, the main output section 101 outputs a L-level signal by lowering the potential of the output node Dout from the H-level to the L-level. In addition, when the input signal DATA changes from a L-level to a H-level, the main output section 101 outputs a H-level signal by raising the potential of the output node Dout from the L-level to the H-level. Although the L-level holding section 102 alone is not capable of lowering the potential of the output node Dout from a H-level to a L-level, the L-level holding section 102 is configured as an assist circuit which can maintain the potential of the output node Dout having a L-level at the L-level.

The main output section 101 includes a P-channel transistor P1 (high-potential-side cut-off transistor), a terminating resistor R1, and N-channel transistors N1 (low-potential-side cut-off transistor) and N2 (output transistor), which are connected in series between the high-potential power source line and the low-potential power source line. The resistor R1 corresponds to the resistor R21 shown in the conventional output circuit 200 (FIG. 6), and the transistor N2 corresponds to the transistor N21 shown in the output circuit 200. The resistor R1 is impedance-matched with the signal transmission line 120, such as having a characteristic impedance of 50Ω. Although not illustrated, the signal transmission line 120 is terminated by a terminating resistance at the input of the external device 121, the terminating resistor being impedance-matched with the signal transmission line by an ODT (on die termination) scheme.

The pulse generation section 103 generates a one-shot pulse which assumes a H-level for a predetermined duration from the switch timing that the input signal DATA changes from a H-level to a L-level. The data stored in the resistor 104 determines the pulse duration of the one-shot pulse which is generated by the pulse generation section 103. The transistor N1 of the main output section 101 has a gate connected to the output of the pulse generation section 103. The transistor N1 is turned ON during the time period when the pulse generation section 103 outputs a H-level, that is, when the one-shot pulse is output. In addition, the gate of the transistor P1 is connected to a NOR gate 106 which outputs NOR of the input signal DATA and the output of the pulse generation section 103. The transistor P1 is turned OFF only in the case that both the input signal DATA and the output of the pulse generation section 103 are at L-level, and is turned ON in other cases.

The L-level holding section 102 includes a P-channel transistor P2 (another cut-off transistor), resistors R2 (first resistor for holding the L-level) and R3 (second resistor for holding the L-level), and an N-channel transistor N3 (another cut-off transistor), which are connected in series between the high-potential power source line and the low-potential power source line. A /Read signal (Read signal with a top bar) and a Read signal which is obtained by inverting the /Read signal by an inverter 107 are input to gates of the transistors P2 and the transistor N3, respectively. Each of the transistors P2 and N3 is turned ON when the /Read signal is at L-level, that is, when the operation of writing data to the external device 121 is to be carried out. When transistors P2 and N3 are turned ON, a resistive voltage divider including the resistors R2 and R3 divides the voltage between the high-potential power source line and the low-potential power source line by the predetermined resistance ratio, to deliver the output signal of the output circuit 100.

The resistance ratio between the resistors R2 and R3 is determined based on the potential difference between the high-potential power source line and the low-potential power source line and the desired potential of the L-level signal so that the potential of the node connecting together the resistors R2 and R3 assumes the desired potential of the L-level signal. For example, if the high-potential power source line is 1.8 V and the L-level potential is 1.4 V, the resistance ratio of the resistors R2 and R3 is set at R2:R3=2:7. The resistors R2 and R3 should have a sufficiently higher resistance compared to the resistor R1 of the main output section 101. For example, if the resistor R1 is 50Ω, both the resistors R2 and R3 are 500Ω which is ten times as large as the resistor R1 or higher. The size of the transistors P1 and N1 of the main output section 101, and the transistors P2 and N3 of the L-level holding section 102 should be sufficiently large to the extent that the output impedance and the current drivability of the output circuit 100 are not affected thereby.

Figure 2:
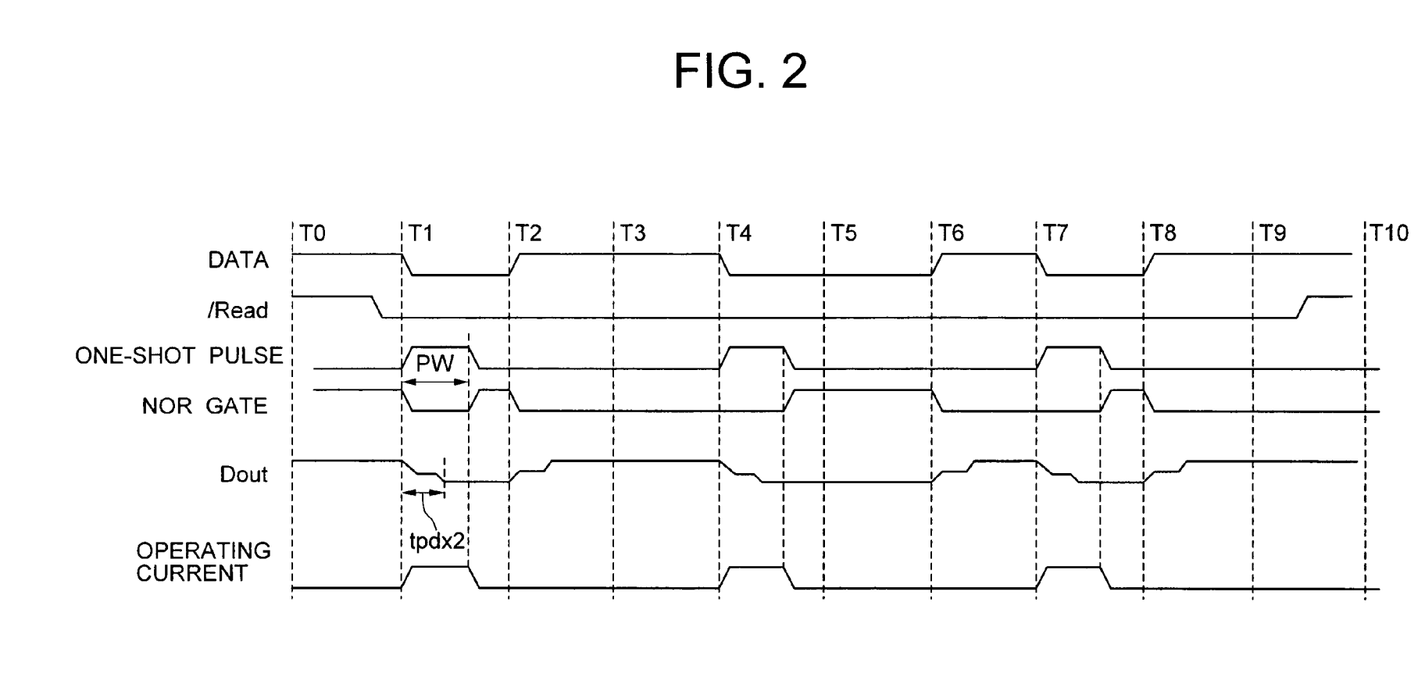
FIG. 2 is a timing chart showing signal waveforms in the output circuit of the first embodiment.

FIG. 2 is a timing chart showing signal waveforms in the output circuit 100. The input signal DATA is input in synchrony with a clock signal (not shown). When the input signal DATA changes from a H-level to a L-level at a transition from the period T0 to the period T1, the pulse generation section 103 generates a one-shot pulse. In this manner, the potential of the gate of the transistor N1 is at a H-level only for the pulse duration, and the transistor N1 is turned ON. In addition, the NOR gate 106 outputs a L-level due to the input signal DATA assuming a L-level and the output of the pulse generation section 103 assuming a H-level, whereby the transistor P1 is turned ON. The transistor N2 is turned ON by receiving a signal at H-level from the inverter 105 to the gate thereof. In the main output section 101, the current flows from the high-potential power source line toward the low-potential power source line through the resistor R1, whereby the potential of the output node Dout gradually falls.

The potential of the output node Dout is not lowered immediately down to a L-level due to the influence by the signal reflection from the external device 121, etc., and thus gradually falls toward the L-level. The time length needed for the output node to be settled at the L-level is equal to the time interval when the signal reciprocates the signal transmission line 120, that is, tpd×2, if the input terminal of the external device 121 is open. During this time interval, it is desirable that the transistors P1 and N1 are kept turned ON. For this reason, the pulse duration PW of the one-shot pulse generated by the pulse generation section 103 should be tpd×2 or more. Specifically, the register 104 stores the data that allows the pulse width PW of the pulse generated by the pulse generation section 103 to be equal to tpd×2 or more.

When the one-shot pulse output by the pulse generation section 103 falls from a H-level to a L-level, both the transistors P1 and N1 of the main output section 101 are turned OFF. At this stage, the potential of the output node Dout falls to a L-level. With the transistors P1 and N1 being turned OFF, the current from the high-potential power source line toward the low-potential power source line through the resistor R1 is cut off. Thus, the node connecting together the resistor R1 and the transistor N2 is in a floating state. Thereafter, the potential of the output node Dout during the period T1 is held at a L-level due to the potential division by the resistors R2 and R3 of the L-level holding section 102. That is, during the period T1, the main output section 101 is operated to lower the potential of the output node Dout from the time instant of changeover of the input signal DATA until the time length of 2×tpd elapses. Thereafter, the operating current of the main output section 101 is cut off to allow the L-level holding section 102 to hold the L-level.

When the input signal DATA changes to a H-level after the transition to the period T2, the output transistor N2 of the main output section 101 is turned OFF. In addition, since the pulse generation section 103 outputs a L-level signal and the NOR gate 106 outputs a L-level signal, the gate potential of the transistor P1 is at a L-level and thus the transistor P1 is turned ON. In this manner, the output node Dout is connected to the high-potential power source line through the resistor R1 of the main output section 101, and the potential of the output node Dout is settled at a H-level slightly later than the signal switch timing.

Here, the output node Dout is also connected to the node connecting together the resistors R2 and R3 of the L-level holding section 102. Therefore, the output node Dout may be considered to be affected by the potential of the connecting node. However, by allowing the resistors R2 and R3 to have a sufficiently higher resistance compared to the resistor R1, the current flows across the resistors R2 and R3 only a little. Therefore, the influence by the resistors R2 and R3 of the L-level holding section 102 is insignificant, and there arises no problem even if the transistors P2 and N3 are kept turned ON.

When the input signal changes to a L-level again at the transition to the period T4, the main output section 101 lowers the potential of the output node Dout to the L-level by allowing the current to flow from the resistor R1 toward the low-potential power source line during the pulse duration of the one-shot pulse generated by the pulse generation section 103, due to an operation similar to the operation during the period T1. Thereafter, the transistors P1 and N1 are turned OFF, and the L-level holding section 102 holds the potential of the output node Dout at the L-level.

In the present embodiment, the main output section 101 lowers the potential of the output node Dout during the predetermined time length after the input signal changes to a L-level. After the potential of the output node Dout is stabilized, the operating current of the main output section 101 is cut off. After the operating current of the main output section 101 is cut off, the L-level holding section 102 holds the potential of the output node Dout at the L-level. In this manner, the operating current during the time period of the L-level output signal can be reduced, as compared to the conventional output circuit 200 in which the current must flow across the resistor R21 (in FIG. 6) during the period when the input signal DATA is at the L-level.

Figure 3:
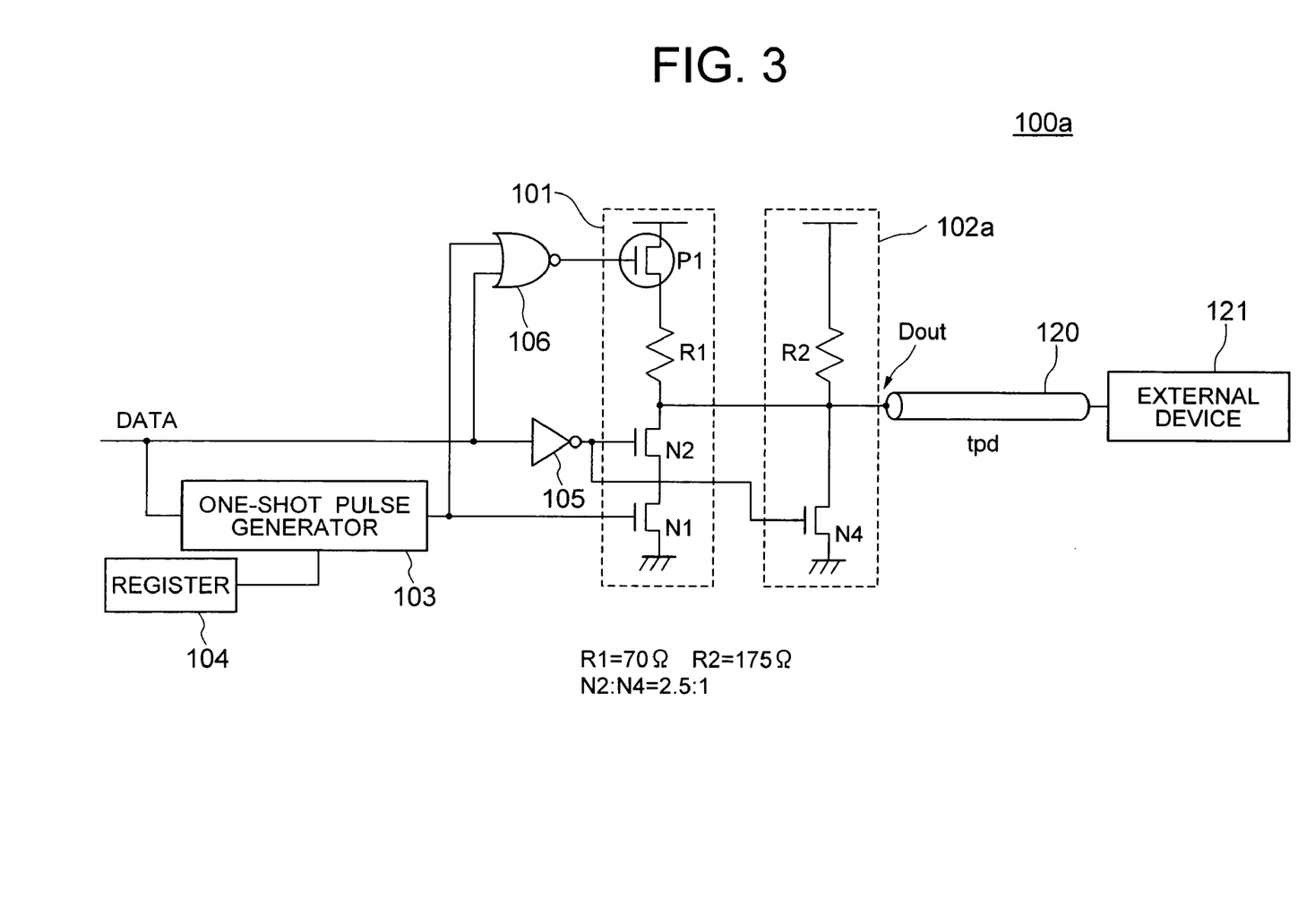
FIG. 3 is a circuit diagram showing the configuration of an output circuit according to a second embodiment of the present invention.

FIG. 3 is a circuit diagram showing the configuration of an output circuit according to a second embodiment of the present invention. The output circuit, generally designated at numeral 100a, of the present embodiment includes a L-level holding section 102a which is different from the L-level holding section 102 of the output circuit 100 of the first embodiment. The L-level holding section 102a includes a transistor N4 which receives an inverted signal of the input signal DATA on the gate thereof, in place of the resistor R3 (FIG. 1). In the present embodiment, parallel resistance of the resistors R1 and R2 is impedance-matched with the signal transmission line 120. For example, if the impedance of the signal transmission line 120 is 50Ω, the resistor R1 is set at 70Ω and the resistor R2 is set at 175Ω. In addition, the ratio of the size of the transistor N4 and the size of the transistor N2 of the main output section 101 is set corresponding to the resistance ratio between the resistors R1 and R2. For example, the ratio of the size of the transistor N4 to the size of the transistor N2 is set at 1:2.5.

Figure 4:
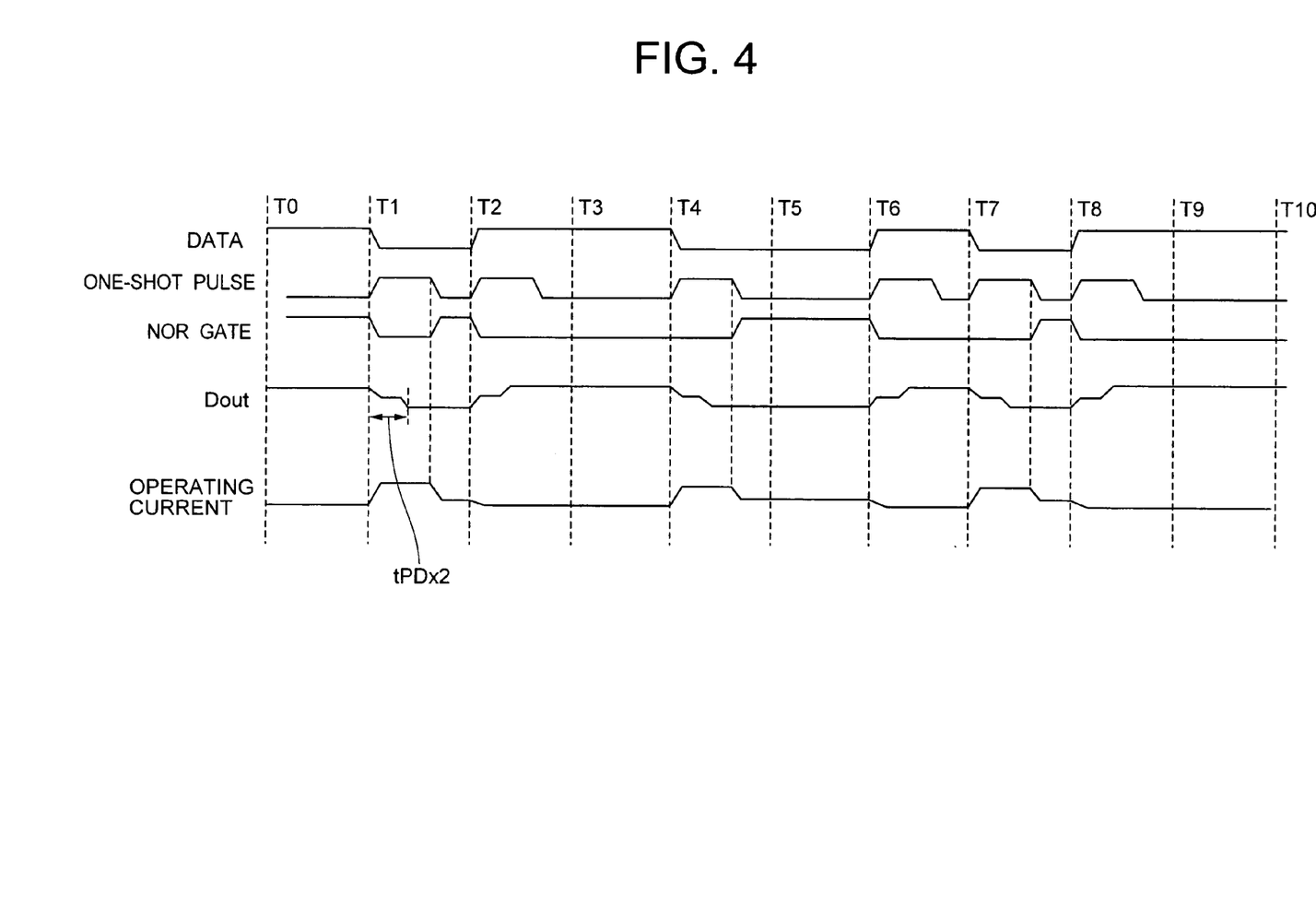
FIG. 4 is a timing chart showing signal waveforms in the output circuit of the second embodiment.

FIG. 4 is a timing chart showing the signal waveforms in the output circuit 100a of the second embodiment. When the input signal DATA changes from a H-level to a L-level at the transition to the period T1, both the transistor N2 of the main output section 101 and the transistor N4 of the L-level holding section 102a are turned ON. In addition, a one-shot pulse generated by the pulse generation section 103 turns ON the transistors P1 and N1. In this manner, in the main output section 101, a current flows across the resistor R1 toward the low-potential power source line, and in the L-level holding section 102a, a current flows across the resistor R2 toward the low-potential power source line. Thereby, the potential of the output node Dout gradually falls toward a L-level.

When the pulse generation section 103 outputs a one-shot pulse, the impedance of the main output section 101 and the L-level holding section 102a as observed from the output node Dout is the parallel resistance (50Ω) configured by the resistor R1 (70Ω) and the resistor R2 (175Ω), and is matched with the impedance of the signal transmission line 120. Assuming that H-level is 1.8 V, L-level is 1.4 V, and thus the signal amplitude is 0.4 V, a current of 0.4 V/50Ω=8 mA is obtained. Therefore, with a current of 8 mA in total flowing across the main output section 101 and the L-level holding section 102a, the potential of the output node Dout falls to the L-level.

When the one-shot pulse generated by the pulse generation section 103 falls to the L-level after the potential of the output node Dout is settled at the L-level, both the transistors P1 and N1 of the main output section 101 are turned OFF, and the current flowing across the resistor R1 toward the low-potential power source line is cut off. On the other hand, the transistor N4 of the L-level holding section 102a is kept turned ON. At this stage, the current flowing across the resistor R2 toward the low-potential power source line in the L-level holding section 102a is obtained as 8 mA×(1/3.5) =2.286 mA since the ratio of the size of the transistor N2 of the main output section 101 to the size of the transistor N4 is 2.5:1. The voltage drop across the resistor R2 is obtained as 175 Ω×2.286 mA=0.4 V. The potential of the output node Dout is held at the L-level by the L-level holding section 102a.

When the input signal DATA changes from the L-level to a H-level after the transition to the period T2, the transistor P1 of the main output section 101 is turned ON and the transistor N2 is turned OFF. In addition, the transistor N4 of the L-level holding section 102a is turned OFF. In this manner, the output node Dout is connected to the high-potential power source line via the resistor R1 of the main output section 101 and the resistor R2 of the L-level holding section 102a. The potential of the output node Dout is settled at a H-level slightly after the signal switch timing. The impedance of the main output section 101 and the L-level holding section 102a as observed from the output node Dout at this stage is 50Ω, and is matched with the impedance of the signal transmission line 120.

In the present embodiment, the main output section 101 and the L-level holding section 102a lower the potential of the output node Dout during the predetermined time length after the input signal changes to the L-level. After the potential of the output node Dout is stabilized, the operating current of the main output section 101 is cut off. After the operating current of the main output section 101 is cut off, the L-level holding section 102a holds the potential of the output node Dout at the L-level. In the L-level holding section 102a, the resistor R2 has a higher resistance compared to the resistor R1 of the main output section 101. The size of the transistor N4 is set smaller than the size of the transistor N2. For this reason, the operating current of the L-level holding section 102a at the stage of holding the L-level is lower than the total of the operating currents in the main output section 101 and the L-level holding section 102a. As compared with the conventional output circuit 200 in which the operating current flows across the resistor R21 (FIG. 6) in all the period where the input signal DATA is at a L-level, the operating current can be reduced during the period of the L-level of the input signal.

In the first embodiment, it is effective if a resistance that is 10 times higher than the resistance of the resistor R1 of the main output section 101 is used for the resistors R2 and R3 of the L-level holding section 102 (FIG. 1). However, in consideration of crosstalk with another data signal, there may be a case in which it is difficult for the L-level holding section 102 having a high resistance to maintain the L-level. In the present embodiment, the resistor R2 of the L-level holding section 102a has a resistance around 3 times as high as the resistance of the resistor R1, and the transistor N4 controls the connection between the resistor R2 and the low-potential power source line in accordance with the input signal DATA. By adopting such a configuration, even if a high resistance cannot be used to hold the L-level, the L-level holding section 102a can hold the potential of the output node Dout at the L-level with a lower operating current after the potential of the output node Dout is lowered to the L-level.

In each of the above embodiments, in order to simplify the description, an example has been described in which the transistors P1, P2, N1 and N3 have a sufficiently large size to the extent that these transistors do not affect the impedance and an current drivability of the output circuit 100. The actual design should be carried out in order to obtain the desired impedance characteristic and current drivability characteristic in consideration of the drivability of the transistors P1, P2, N1, and N3. In addition, in the above embodiment, the description was made for an example in which the duration of the one-shot pulse generated by the pulse generation section 103 can be adjusted in accordance with the data stored in the register 104. However, if the delay time of the signal transmission line 120 is fixed, the duration of the one-shot pulse generated by the pulse generation section 103 may be a fixed value.

Figure 5:
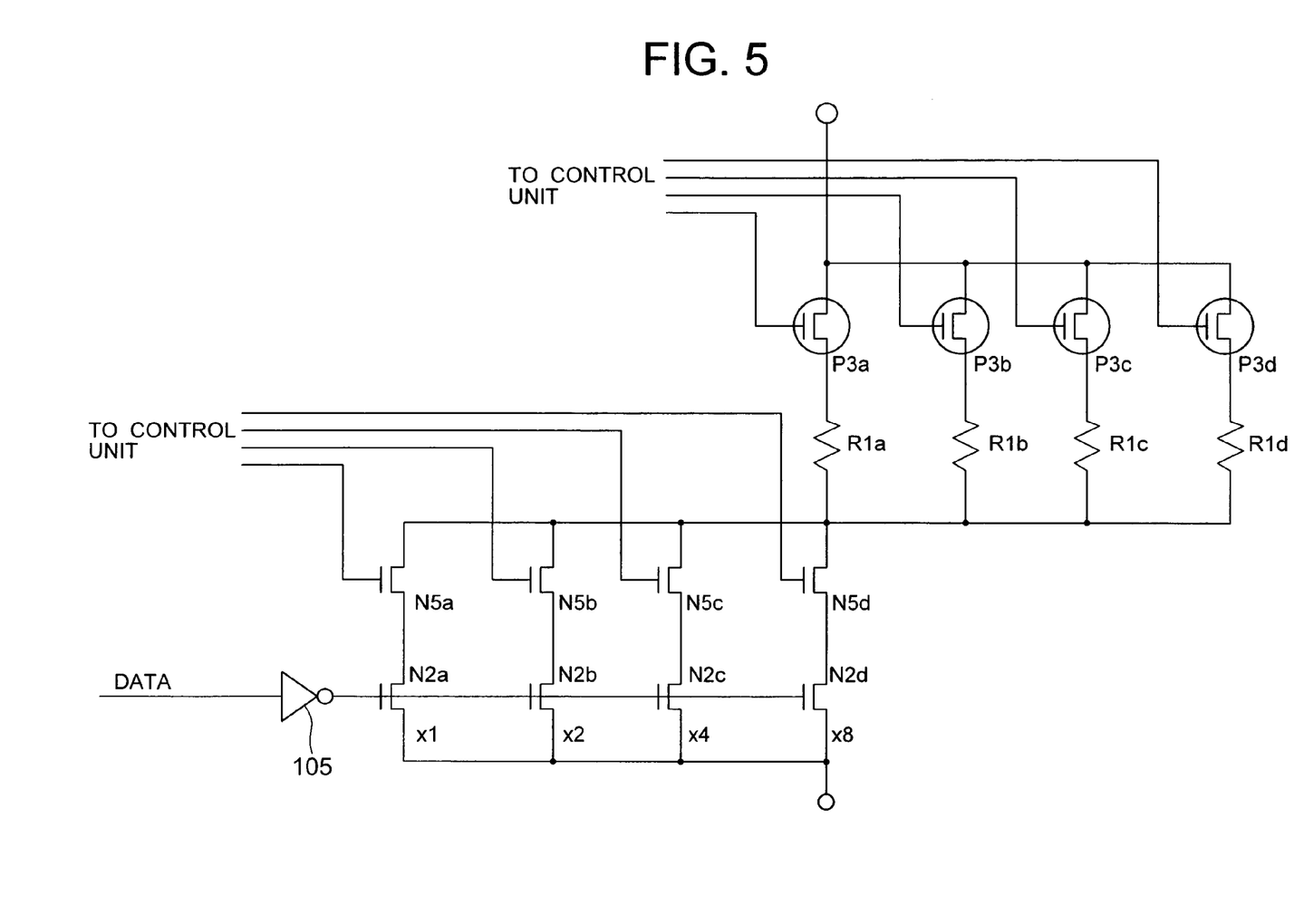
FIG. 5 is a circuit diagram showing a part of the configuration of a modification from the principal part of the output section of FIG. 3.

FIG. 5 shows part of the configuration of a modification of the main output section from the above embodiment. The circuit portion shown in FIG. 5 corresponds to the portion where the resistor R1 and the transistor N2 are connected in series in FIG. 1 (or FIG. 3). In this example, the resistor R1 is replaced by a parallel connection of a plurality of resistors R1a to R1d having a resistance different from one another. The transistor N2 is replaced by a parallel connection of a plurality of transistors N2a to N2d having a size different from one another. The connection and cut-off of the resistors R1a to R1d are controlled by transistors P3a to P3d which are controlled based on a control signal from the control unit not shown in the figure.

The connection and cut-off of the transistors N2a to N2d used for the signal output are controlled by transistors N5a to N5d, respectively, which are controlled based on the control signal delivered from the control unit. For the output transistors N2a to N2d, the size ratio is designed, for example, at a ratio of 1:2:4:8 therebetween. The control unit controls the number of parallel connections of the resistors R1a to R1d and determines what transistor is to be used among the transistors N2a to N2d, in order to obtain the desired impedance and the current drivability of the output circuit. By adopting the configuration as described above for the main output section 101, the impedance and the current drivability of the output circuit 100 can be configured in a programmable scheme.

Since the above embodiments are described only for examples, the present invention is not limited to the above embodiments and various modifications or alterations can be easily made therefrom by those skilled in the art without departing from the scope of the present invention.

What is claimed is:

1. An output circuit comprising:
   an input node configured to receive an input signal;
   an output node configured to output an output signal;
   a main output section configured to output a high level signal to said output node in response to a first level of said input node, to output a low level signal to said output node in response to a second level of said input node until a level of said output node becomes said low level, and to deactivate the outputting of the low level signal to said output node when a level of said output node becomes said low level; and
   a low-level holding section configured to maintain said output node at said low level in response to said second level of said input node,
   wherein said main output section includes a terminating resistor connected between a high-potential power source line and said output node, and an output transistor connected between said output node and a low-potential power source line and controlled for ON or OFF depending on the level of said input signal, and
   wherein said main output section further includes a first cut-off transistor connected between said terminating resistor and said high-potential power source line, and a second cut-off transistor connected between said output transistor and said low-potential power source line, and wherein said first and second cut-off transistors are ON until a level of said output node becomes said low level, and OFF when a level of said output node becomes said low level.

2. The output circuit according to claim 1, wherein said first cut-off transistor is ON at least during a period of a level of said output signal being said high level.

3. The output circuit according to claim 2, wherein said main output section further includes a one-shot pulse generator for generating a one-shot pulse having a pulse duration defining a period of said main output section outputting the low level signal to said output node.

4. The output circuit according to claim 3, wherein said main output section further includes a register for storing data defining said pulse duration of said one-shot pulse.

5. The output circuit according to claim 1, wherein said low-level holding section includes a first resistor connected between said high-potential power source line and said output node and having a higher resistance higher than said terminating resistor, and a second resistor connected between said output node and said low-potential power source line and having a higher resistance than said terminating resistor.

6. The output circuit according to claim 5, wherein said terminating resistor is impedance-matched with a signal transmission line connected between said output node and an external circuit receiving the output signal of said output circuit.

7. The output circuit according to claim 1, wherein said low-level holding section includes a first resistor connected between said high-potential power source line and said output node and having a higher resistance than said terminating resistor, and a low-level holding transistor connected between said output node and said low-potential power source line and controlled for ON or OFF by said input signal.

8. The output circuit according to claim 7, wherein a combined resistance of said terminating resistor and said first resistor is impedance matched with a signal transmission line connected between said output node and an external circuit receiving the output signal of said output circuit.

9. The output circuit according to claim 7, wherein a ratio of a size of said output transistor to a size of said low-level holding transistor is determined based on a ratio of a resistance of said terminating resistor to a resistance of said first resistor.

10. The output circuit according to claim 1, wherein said main output section includes a plurality of resistors connected in parallel between a high-potential power source line and said output node, and a plurality of output transistors connected in parallel between said output node and a low-potential power source line and controlled for ON or OFF depending on the level of said input signal.

11. The output circuit according to claim 1, wherein a operation current of said low-level holding section is smaller than that of said main output section.

12. The output circuit according to claim 10, further comprising control means for controlling respective parallel connections of the plurality of resistors by switching one or more of the plurality of output transistors on or off, in order to obtain a particular impedance value and drivability of the output circuit.

13. An output circuit comprising:
an input node receiving an input signal, the input signal taking a first level during a first period of time and changing to a second level from the first level, the input signal taking the second level during a second period of time, the second period of time including first and second partial periods of time, the first partial period of time being between the first period of time and the second partial period of time;
an output node outputting an output signal;
a main output section driving the output node to a first logic level during the first period of time, and to a second logic level during the first partial period of time, the main output section being deactivated during the second partial period of time to be released from driving the output node; and
a level holding section holding the output node at the second logic level during at least the second partial period of time.

14. The output circuit according to claim 13, wherein said main output section includes an output transistor coupled to said output node and a first power supply line and having a control terminal electrically coupled said input node.

15. The output circuit according to claim 14, wherein said main output section includes a first resistor having one end electrically coupled said output node and the other end electrically coupled a second power supply line.

16. The output circuit according to claim 15, wherein said level holding section has a second resistor, and a resistance of said second resistor is larger than that of said first resistor.

17. The output circuit according to claim 13, wherein a current flowing through said main output section which is activated is larger than a current flowing through said level holding section.

18. The output circuit according to claim 17, wherein said currents flow during at least the first partial period of time.

19. The output circuit according to claim 16, wherein said level holding section has a third resistor, and a resistance of said third resistor is larger than that of said first resistor.

20. The output circuit according to claim 19, wherein said second resistor is electrically coupled to said output node and said second power supply line, and said third resistor is electrically coupled to said output node and said first supply line, and a resistance of said second resistor is larger than that of said third resistor.

21. The output circuit according to claim 16, wherein said level holding section has a first transistor having a different size from a size of said output transistor.

22. The output circuit according to claim 21, wherein said second resistor is electrically coupled to said output node and said second power supply line, and said first transistor is electrically coupled to said output node, said first power supply line and having a control terminal electrically coupled said input node.

23. An output circuit comprising:
an input node receiving an input signal;
an output node outputting an output signal;
a main output section electrically coupled to said output node without a transistor, outputting a high level signal to said output node in response to a first level of said input node, outputting a low level signal to said output node in response to a second level of said input node, and deactivating the outputting of the low level signal to said output node when a level of said output node becomes said low level; and
a low-level holding section maintaining said output node at said low level in response to said second level of said input node,
wherein said main output section includes an output transistor having a first terminal coupled to said output node, a second terminal coupled to a first power supply line and a control terminal coupled to said input node,
wherein said main output section includes a first resistor having one end coupled to said output node and the other end coupled to a second power supply line,
wherein said main output section includes a first cut-off circuit coupled to said first resistor and said second power supply line and a second cut-off circuit coupled to said output transistor and said first power supply line.

24. The output circuit according to claim 23, wherein said first cut-off circuit electrically couples first resistor and said second power supply line for a predetermined period from a transition of said input node said first level to said second level, and said second cut-off circuit electrically couples said output transistor and said first power supply line for said predetermined period.

25. The output circuit according to claim 23, wherein said main output section includes a one-shot-pulse generator, said one-shot-pulse generator supplies control signals to said first and second cut-off circuits.

26. The output circuit according to claim 23, wherein said first cut-off circuit is a first transistor having a first conductivity type and said second cut-off circuit is a second transistor having a second conductivity type opposite of said first conductivity type.

27. The output circuit according to claim 23, wherein said main output section is connected between a first power supply line and a second power supply line, and said low-level holding section is connected between said first power supply line and said second power supply line.

28. An output circuit comprising:
an input node receiving an input signal;
an output node outputting an output signal;
a main output section electrically coupled to said output node without a transistor, outputting a high level signal to said output node in response to a first level of said input node, outputting a low level signal to said output node in response to a second level of said input node, and deactivating the outputting of the low level signal to said output node when a level of said output node becomes said low level; and a low-level holding section maintaining said output node at said low level in response to said second level of said input node, wherein said main output section includes an output transistor having a first terminal coupled to said output node, a second terminal coupled to a first power supply line and a control terminal coupled to said input node, wherein said main output section includes a first resistor having one end coupled to said output node and the other end coupled to a second power supply line, wherein said output transistor is a plurality of output transistors connected in parallel between said output node and said first power supply line, and said first resistor is a plurality of resistor connected in parallel between said output node and said second power supply line.

29. The output circuit according to claim 23, wherein an operation current of said low-level holding section is smaller than that of said main output section.

30. The output circuit according to claim 13, wherein each of the first level and the second logic level is a low level, and each of the second level and the first logic level is a high level.

31. The output circuit according to claim 13, further comprising a pulse generator circuit generating a pulse signal taking an active level during the first partial period of time, taking an inactive level during at least the second partial period of time, and wherein the main output section includes a first transistor, the first transistor is coupled between the output node and a power supply line and has a control terminal supplied with the pulse signal.

* * * * *